United States Patent
Rao et al.

(10) Patent No.: US 8,130,535 B2
(45) Date of Patent: Mar. 6, 2012

(54) FLEXIBLE WORD-LINE PULSING FOR STT-MRAM

(75) Inventors: Hari M. Rao, San Diego, CA (US); Sei Seung Yoon, San Diego, CA (US); Medhi Sani, San Diego, CA (US); Seung Duk Lee, San Diego, CA (US); Sung Cho, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 184 days.

(21) Appl. No.: 12/551,874

(22) Filed: Sep. 1, 2009

(65) Prior Publication Data

US 2011/0051502 A1 Mar. 3, 2011

(51) Int. Cl.
 *G11C 11/00* (2006.01)
(52) U.S. Cl. .................. 365/158; 365/194; 365/189.05; 365/233.11
(58) Field of Classification Search .................. 365/158, 365/194, 189.05, 233.11, 201; 327/291, 327/156, 158
See application file for complete search history.

(56) References Cited

U.S. PATENT DOCUMENTS

| | | | |
|---|---|---|---|
| 4,994,687 A | 2/1991 | Fujii et al. | |
| 5,422,585 A | 6/1995 | Fan Chiangi et al. | |
| 5,959,485 A | 9/1999 | Roohparvar | |
| 6,972,998 B1 * | 12/2005 | Gibson et al. | 365/189.05 |
| 7,224,639 B2 * | 5/2007 | Lee | 365/194 |
| 7,349,270 B2 * | 3/2008 | Sawhney | 365/196 |
| 2006/0097755 A1 | 5/2006 | Yamanaka | |

OTHER PUBLICATIONS

International Search Report and Written Opinion—PCT/US2010/047526, International Search Authority—European Patent Office—Nov. 18, 2010.

* cited by examiner

*Primary Examiner* — David Lam
(74) *Attorney, Agent, or Firm* — Sam Talpalasky; Nicholas J. Pauley; Jonathan T. Velasco (57) ABSTRACT

A method for generating a variable pulse width signal on an integrated circuit (IC) chip, includes receiving a first clock signal on the IC chip and receiving a second clock signal on the IC chip having a variable delay relative to the first clock signal. A signal having a rising edge triggered by a rising edge of the first clock signal and a falling edge triggered by a rising edge of the second clock signal is output. The output signal is provided to circuitry on the chip, such as a magnetoresistive junction (MTJ) cell of a spin torque transfer magnetic random access memory (STT-MRAM).

27 Claims, 9 Drawing Sheets

FLEXIBLE WORD-LINE PULSING FOR STT-MRAM

FIELD OF DISCLOSURE

The disclosure relates generally to testing technologies for electronic circuits and, more specifically, to a method and apparatus for testing magneto-resistance random access memory.

BACKGROUND

Magneto-resistance random access memory (MRAM) is attractive as a form of memory in many applications. It is capable of being integrated on-chip within the standard integrated circuit (IC) architecture. MRAM is non-volatile, not requiring power to maintain a memory state, i.e., the memory state is not lost in the event of a power loss. MRAM is based on writing and reading a tunneling resistance value of a magneto-resistive tunnel junction (MTJ). A MRAM bitcell includes an MTJ cell and a switch, which may be a transistor, for example. An MTJ cell is a junction having a fixed polarization magnetic layer and a free (i.e., re-writable) polarization magnetic layer separated by an electrically insulating tunneling layer.

In conventional MRAM, the free layer polarization is written by imposing an external magnetic field of sufficient strength. The tunneling resistance may commonly have two values depending on whether the free layer polarization is parallel or anti-parallel to the fixed layer. The tunneling resistance is lower in the parallel polarization state than in the anti-parallel polarization state.

Spin torque transfer (STT) MRAM is a form of MRAM where a reversible external magnetic field is not required to toggle the free layer polarization. This is accomplished by applying a sufficient density of spin polarized electron current through the junction. Parallel polarization occurs when the electrons in a write current flow from the fixed to the free layer. Anti-parallel polarization occurs when the write current flows in the opposite direction. Read current densities are generated by voltages that are too small to switch the free layer polarization, but otherwise operate in a similar manner, to measure the tunneling resistance and thereby determine the state of the MTJ cell.

Just as in standard IC testing, large arrays of memory may require testing of every memory cell. One part of testing is the characterization of read/write (R/W) speeds and critical currents, current densities and voltages. The amount of current density (as determined by the amount of applied voltage) required and the pulse width required to perform either read or write functions reliably may be measured.

STT MRAM has the capability to provide relatively high speed, low power, non-volatile memory. The (R/W) speed may be less than 1 nanosecond (ns). Pulse width characterization should therefore extend from less than 1 ns to effective DC. However, conventional test equipment may not be capable of providing sub-nanosecond pulse width signals. Standard testers, such as the Advantest T5585 memory tester (Advantest America Corporation, Santa Clara, Calif.) may have a minimum pulse width of 1 ns, for example, and may also have a maximum available pulse width (e.g., commonly a few ms). Furthermore, off-chip and on-chip capacitance, inductance and resistance existing between the tester port and the MTJ cell on-chip may prevent accurate measurements at the highest speeds, i.e., sub-nanosecond pulse widths, preventing an accurate determination of how fast the MTJ cell may be capable of operating in read and write modes.

In the interest of performance, including without limitation, power consumption, where battery life may be extended in portable applications, it is desirable to determine the least amount of power required to read and write to a memory bitcell based on the minimum pulse width and voltage required.

SUMMARY

In one embodiment, a method for generating a signal having a variable pulse width on a semiconductor device, includes receiving a first clock signal on the semiconductor device; and receiving a second clock signal on the semiconductor device having a variable delay relative to the first clock signal. The method also includes outputting a final signal having a rising edge triggered by the first clock signal and a falling edge triggered by the second clock signal. The method further includes providing the final output signal to circuitry on the semiconductor device.

In another aspect, an on-chip variable pulse width signal generating circuit includes a first on-chip latch configured to receive a first clock signal; and a second on-chip latch configured to receive a second clock signal delayed from the first clock signal by a variable amount. The circuit also includes an on-chip set-reset latch configured to receive a signal output from the first latch and a signal output from the second latch, and further configured to output a pulse of time duration based on a delay of the signal from the second latch relative to the signal from the first latch.

In yet another aspect, an on-chip variable pulse width signal generating circuit for testing a spin-torque-transfer (STT) magnetic tunnel junction (MTJ) memory cell includes a first on-chip latch configured to receive a first clock signal. The circuit also includes a second on-chip latch, and an on-chip set-reset latch. The second on-chip latch is configured to receive a second clock signal delayed from the first clock signal by a variable amount. The on-chip set-reset latch is configured to receive a signal output from the first latch and a signal corresponding to an output from the second latch, and further configured to output a pulse of time duration based on the delay of the second clock signal relative to the signal from the first clock signal. The STT-MTJ memory cell is configured to receive a final signal based on the output pulse from the set-reset latch. The STT-MTJ memory cell includes a bit line, an MTJ, a transistor source, and a transistor gate. The bit line is adapted to receive a bit line voltage. The MTJ has a free magnetic layer coupled to the bit line and a fixed magnetic layer coupled to a drain of a transistor. The source of the transistor is coupled to a source line adapted to receive a source line voltage. The gate of the transistor is adapted to receive a signal corresponding to the output pulse of the set-reset latch.

In still another aspect, an on-chip variable pulse width signal generating circuit including a first on-chip means for receiving a first clock signal; and a second on-chip means for receiving a second clock signal delayed from the first clock signal by a variable amount. The circuit also includes a third on-chip means for receiving a signal output from the first receiving means and a signal output from the second receiving means, and for outputting a pulse of time duration based on a delay of the signal received by the second receiving means relative to the signal received by the first receiving means.

The foregoing has outlined rather broadly the features and technical advantages of the present disclosure in order that the detailed description of embodiments of the disclosure that follows may be better understood. Additional features and advantages of the disclosure will be described hereinafter which form the subject of the claims of the disclosure. It should be appreciated by those skilled in the art that the conception and specific embodiments disclosed may be readily utilized as a basis for modifying or designing other structures for carrying out the same purposes of the present disclosure. It should also be realized by those skilled in the art that such equivalent constructions do not depart from the spirit and scope of the disclosure as set forth in the appended claims. The novel features which are believed to be characteristic of the disclosure, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following descriptions taken in conjunction with the accompanying drawings.

DETAILED DESCRIPTION

A method and apparatus are disclosed for testing memory on an integrated circuit chip. The chip includes memory bitcells and on-chip circuitry adapted to provide a variable pulse width signal to each memory bitcell based on one or more external clock signals received by the chip.

Figure 1:
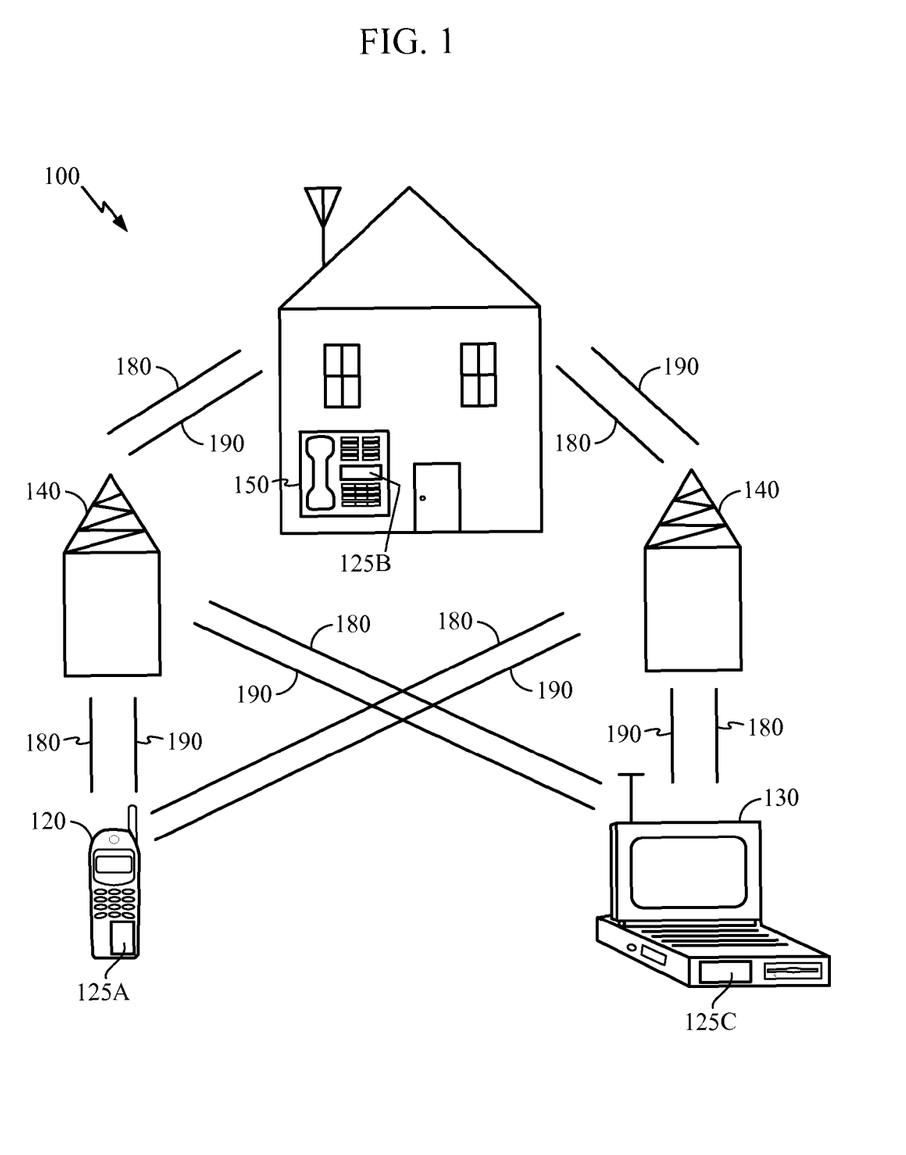
FIG. 1 is a block diagram showing an exemplary wireless communication system in which an embodiment of the disclosure may be advantageously employed.

FIG. 1 shows an exemplary wireless communication system 100 in which an embodiment of the disclosure may be advantageously employed. For purposes of illustration, FIG. 1 shows three remote units 120, 130, and 150 and two base stations 140. It will be recognized that typical wireless communication systems may have many more remote units and base stations. Remote units 120, 130, and 150 include powered integrated circuit devices 125A, 125B, and 125C, respectively, which utilize embodiments of the disclosure as discussed further below. FIG. 1 shows forward link signals 180 from the base stations 140 and the remote units 120, 130, and 150 and reverse link signals 190 from the remote units 120, 130, and 150 to base stations 140.

In FIG. 1, remote unit 120 is shown as a mobile telephone, remote unit 130 is shown as a portable computer, and remote unit 150 is shown as a fixed location remote unit in a wireless local loop system. For example, the remote units may be cell phones, hand-held personal communication systems (PCS) units, portable data units such as personal data assistants (PDAs), navigation devices (e.g., GPS enabled devices) or fixed location data units such as meter reading equipment. Although FIG. 1 illustrates remote units according to the teachings of the disclosure, the disclosure is not limited to these exemplary illustrated units. Embodiments of the disclosure may be suitably employed in any device which includes active integrated circuitry including memory and on-chip circuitry for test and characterization.

The integrated circuit devices 125A, 125B, and 125C may be coupled to a microprocessor or other microelectronic device. The integrated circuit devices 125A, 125B, and 125C may be packaged with the microprocessor and further incorporated into a communications device. For example, the circuit may be embedded in a mobile phone or a communications base station.

Figure 2A:
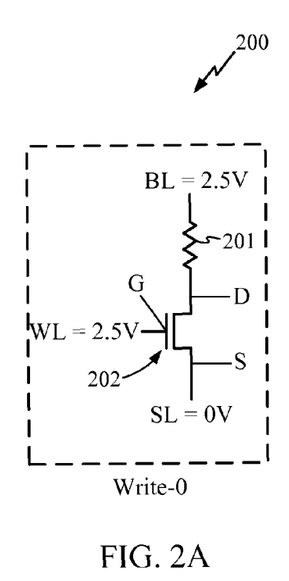
FIGS. 2A-2C are circuit diagrams of an STT-MRAM bitcell in various operational modes.
Figure 2B:
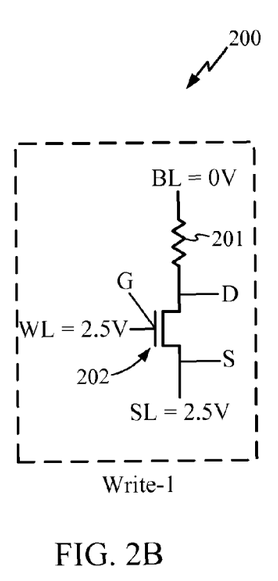
Figure 2C:
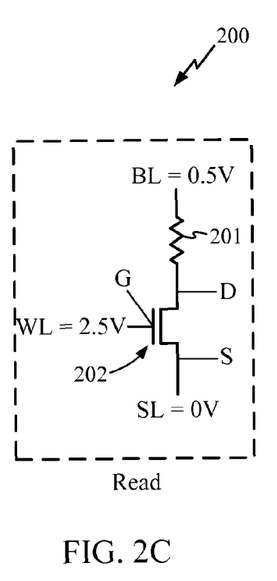

FIGS. 2A-2C show an STT MRAM bitcell 200 under three write/read conditions in accordance with the present disclosure. An STT MRAM bitcell 200 may be regarded functionally as a variable resistance magnetic tunnel junction (MTJ) 201 in series with a switch 202, which in one embodiment may be a transistor 202. The MTJ resistance has two nominal values, depending on a polarization direction of the free layer relative to the fixed layer. In the embodiment shown in FIGS. 2A-2C, a bit line BL is electrically connected to the free layer (not shown) of the MTJ 201; the fixed layer (not shown) is electrically connected to a drain D of the transistor 202; a source S of the transistor 202 is connected to a source line SL; a gate G of the transistor 202 is electrically connected to a word line, which provides a word line signal, WL. The voltage levels shown in FIGS. 2A-2C are non-limiting examples.

In this configuration, as shown in FIG. 2A, when the bit line BL is held at a sufficiently positive voltage (e.g., 2.5 V) relative to the source line SL, and the word line signal, WL, applied to the gate G of the transistor 202 is at a sufficiently high voltage (e.g., 2.5 V) to permit current to flow through the transistor 202 from drain D to source S, the current direction flowing through the MTJ 201 corresponds to the negatively charged electrons flowing in the opposite direction. In passing through the fixed layer, the electrons become polarized, and the density of the electron current is sufficient to polarize the free layer parallel to the fixed layer because of the spin transfer torque (STT) phenomenon. The parallel polarization of the magnetization direction of the fixed and free layers results in a tunneling resistance referred to as a state 0. As shown in FIG. 2B, reversing the relative voltages at the bit line, BL, and source line, SL, when the word line signal, WL, applied is high, the free layer is polarized anti-parallel to the fixed layer. The tunneling resistance, which is higher than the resistance of the MTJ 201 in the 0-State (FIG. 2A), is referred to as the state 1.

A larger difference in the resistance of the two states makes a determination of the memory state of the STT MRAM bitcell 200 easier and more reliable during read. During write, at least two factors affect the ability to properly write a reliable 0-state or 1-state to the MTJ 201. First, the voltage applied between the bit line BL and source line SL should be sufficient to produce a current through the MTJ 201 that at least exceeds a critical current when the word line signal, WL, is sufficient to open the gate G of the transistor 202. Second, the word line signal, WL, should be applied for a sufficient period of time for the polarized electron current to write the desired state 0 or 1 to the MTJ 201. Assuming the critical current is known, and the voltage between the bit line BL and the source line SL and word line WL voltage are appropriately chosen to provide a sufficient current, it is the time period, i.e., the "pulse width" of the word line signal, WL, that controls producing the desired polarization states.

In a read mode, i.e., as shown in FIG. 2C, the voltage applied between the bit line BL and source line SL may be too small (e.g., 0.5 V) to generate a current large enough to change the polarization of the free layer. After the desired state 0 or 1 of the MTJ 201 is written as a function of the variable pulse width, the resulting resistance of the STT MRAM bitcell 200 may then be measured, or "read," at the smaller voltage (e.g., 0.5 V). In some embodiments of an STT MRAM bitcell 200, the pulse width used to write a state 0 or state 1 may be as short as 0.5 nanoseconds (ns), or less. However, some test equipment may be limited in how short a pulse it can deliver to a chip. Additionally, cables, off-chip circuit board traces, and on-chip traces may include complex impedance (i.e., capacitance, resistance and inductance) that may limit the rise and fall times of pulses sourced by the test equipment. Therefore, an on-chip variable pulse width forming circuit placed in close proximity and configured to generate word line signals, WL, to the word line of the STT MRAM bitcell 200 is disclosed that overcomes the pulse forming and reactance limitations mentioned above.

Figure 3:
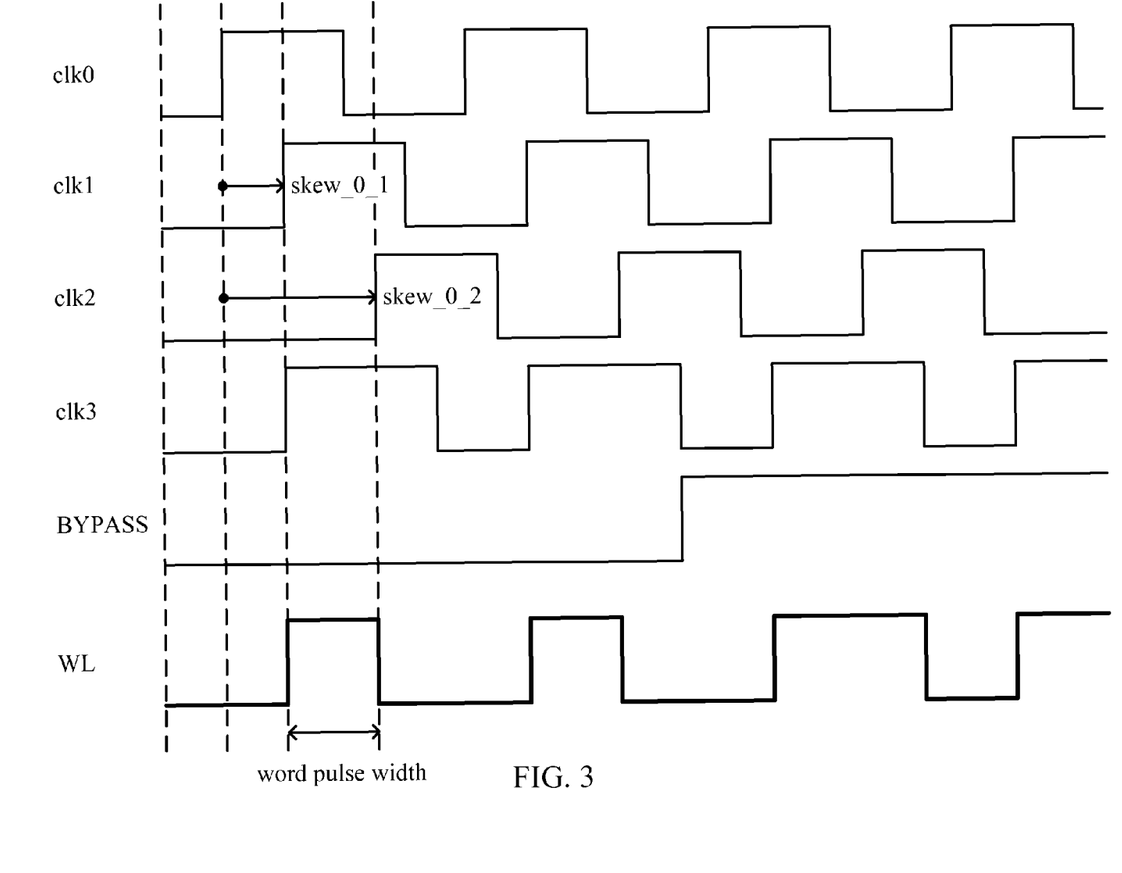
FIG. 3 is a timing diagram of input and output signals of an on-chip circuit for variable pulse width formation.

FIG. 3 shows a timing diagram for variable pulse width formation of input and output signals for an embodiment of an on-chip circuit in accordance with the disclosure. An external source such as, for example, an Advantest T5585 may provide several clock signals. For example, a zero reference clock signal, clk0 (e.g., a system clock), provides a periodic reference pulse, from a reference channel, whose rising edge may serve as a reference for determining the delay ("skew") of other clock signals that may be provided. A first clock signal, clk1, provides a periodic pulse of the same period as the zero reference clock signal, clk0, on a "first" channel with a rising edge delayed from the rising edge of the zero reference clock signal, clk0, by a first amount, i.e., skew [0-1]. A second clock signal, clk2, provides a periodic pulse of the same period on a second channel with a rising edge delayed from the rising edge of the zero reference clock signal, clk0, by a second amount, i.e., skew [0-2]. A third clock signal, clk3, may also be provided, either from the same tester, or from another source. The third clock signal, clk3, can be a signal of any pulse width duration, from substantially zero to direct current (DC).

In this example, the second clock signal, clk2, may be skewed (i.e., delayed) relative to the first clock signal, clk1, by a certain amount, e.g., skew [0-2]-skew [0-1]. The Advantest T5585 can provide, for example, a periodic signal of pulses on several channels, where each pulse has a minimum pulse width of about 1 ns at a minimum repetition interval of about 4 ns, up to a maximum pulse width of 0.5 ms at a maximum repetition interval of about 4 ms. The pulse forming circuit (described in detail below) starts a word line signal, WL, based on the rising edge of the first clock signal, clk1, and stops the word line signal, WL, based on the rising edge of the second clock signal, clk2. The skew delay between the first clock signal, clk1, and the second clock signal, clk2, from the Advantest T5585 may range from approximately 0.1 ns in the 4 ns repetition interval range to approximately 0.9 ms in the 4 ms repetition interval range. Thus, it can be seen that while the tester may not be able to provide a pulse less than about 1 ns in duration, it can provide two skewed clock pulses that may be applied to the pulse forming circuit to form a pulse in the word line signal, WL, ranging approximately from less than 1 ns to 0.9 ms in duration.

In addition, as described in more detail below, a bypass signal, BYPASS, may be provided to the pulse forming circuit that, when applied, may be provides a word line signal, WL, that is a time replica of the third clock signal, clk3, overriding the pulse determined by the skew between the first clock signal, clk1, and the second clock signal, clk2. The third clock signal, clk3, may be a pulse of any duration, including up to DC. The word line signal, WL, formed by either the relative skew of first clock signal, clk1 and the second clock signal, clk2, or by the third clock signal, clk3, may be the applied to the gate G of the transistor 202 of the particular MTJ bitcell 200 under test.

Figure 4:
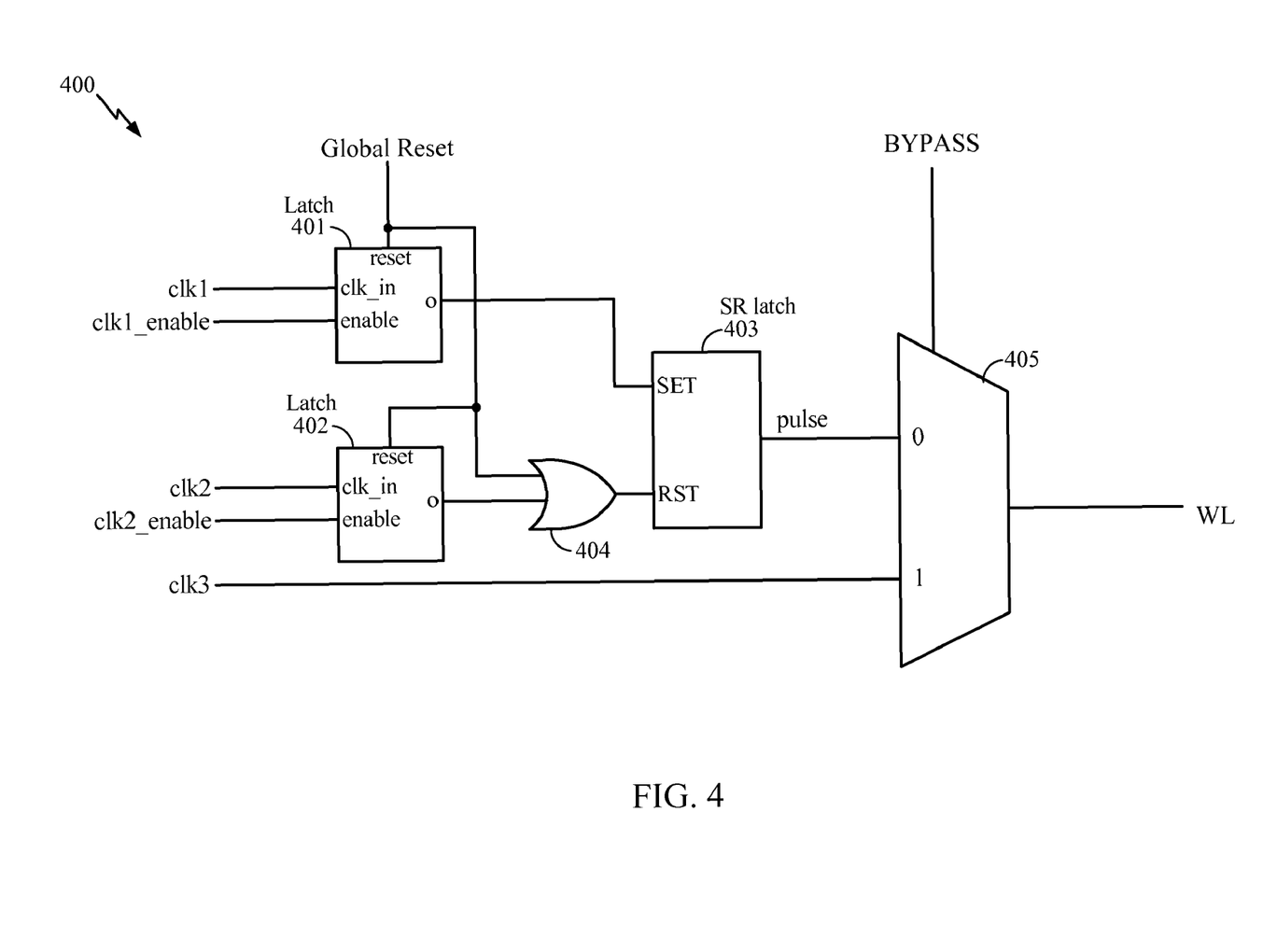
FIG. 4 is a circuit diagram showing an embodiment of an on-chip circuit for variable pulse width formation.

FIG. 4 shows an on-chip variable pulse-width forming circuit 400 in accordance with an embodiment of the disclosure. The forming circuit 400 includes two latches 401 and 402 (e.g., phase 2 (Ø2) latches). Each of the latches 401, 402 receives a respective clock signal and clock enable signal. That is, the latch 401 receives the first clock signal, clk1, and a first clock enable signal, clk1_enable, and the latch 402 receives the second clock signal, clk2, and a second clock enable signal, clk2_enable.

When properly triggered, the latch 401 becomes transparent and passes the first clock signal, clk1, to a set-reset latch SR 403. When properly triggered, the latch 402 becomes transparent and passes the second clock signal, clk2, first to an OR gate 404 and then to the SR latch 403. The latch 401 and the latch 402 are triggered to become transparent when respectively receiving the first clock enable signal, clk1_enable, and second clock enable signal, clk2_enable. When the latch 401 receives the first clock enable signal, clk1_enable, becoming transparent to the first clock signal, clk1, the first clock signal, clk1, is applied to an input SET of the SR latch 403. A rising edge of the first clock signal, clk1, sets the SR latch 403, making it transparent, and the first clock signal, clk1, passes through. Similarly, when the SR latch 402 receives the second clock enable signal, clk2_enable, becoming transparent to the second clock signal, clk2, the second clock signal, clk2, is applied, via the OR gate 404, to a reset input RST of the SR latch 403 to reset the SR latch 403. A high second clock signal, clk2, such as the rising edge of the second clock signal, clk2, resets the SR latch 403 and makes it opaque, ending the signal passing through the SR latch 403. Thus, a pulse signal, pulse, has a pulse width determined by the delay between the leading edges of the first clock signal, clk1, and the second clock signal, clk2. The delay may be variable, and of much shorter duration than a pulse length of either of the first and second clock signals, clk1 and clk2.

Additionally, the latch 401, the latch 402 and the OR gate 404 have inputs for a Global Reset signal. When the Global Reset signal goes high (i.e., a logical "1"), both latches 401 and 402 provide an output that goes low. The OR gate 404 receives the high Global Reset signal and accordingly resets the SR latch 403 to output a low signal, i.e., no pulse. The Global Reset signal performs the function of starting each test measurement sequence with the pulse signal, pulse, low, i.e., closing the gate G so that the transistor 202 is an open circuit, and the state of the MTJ bitcell 200 can be neither written to nor read from.

A multiplexer, mux 405 is configured to receive the output signal, pulse, from the SR latch 403, the third clock signal, clk3, and the bypass signal, BYPASS. The output signal from the mux 405 depends on the level of the bypass signal, BYPASS. When the bypass signal, BYPASS, is set high, i.e., to "1", the mux 405 outputs the third clock signal, clk3. When the bypass signal, BYPASS, is high, the mux 405 outputs a pulse word line, WL, of pulse width determined by the third clock signal, clk3. Thus, the mux 405 enables the pulse width forming portion of the circuit 400 to be substantially bypassed if, for example, there is a malfunction in any of the corresponding pulse forming circuitry (e.g., the latches 401, 402, 403 and the OR gate 404). Pulse forming and testing functionality is retained to the extent that a word line signal, WL, based on the third clock signal, clk3, is available. Conversely, when the bypass signal, BYPASS, is set low ("0"), the mux 405 outputs the a word line signal WL, based on the pulse output from the SR latch 403. In one embodiment, local word lines and global word lines can be used. In this case, whichever signal is output from the mux 405, as determined by the bypass signal, BYPASS, may be ANDed with a global word line signal (not shown) to provide a local word line signal (not shown) to the gate G of the transistor 201 of the MTJ bitcell 200 being tested.

Figure 5:
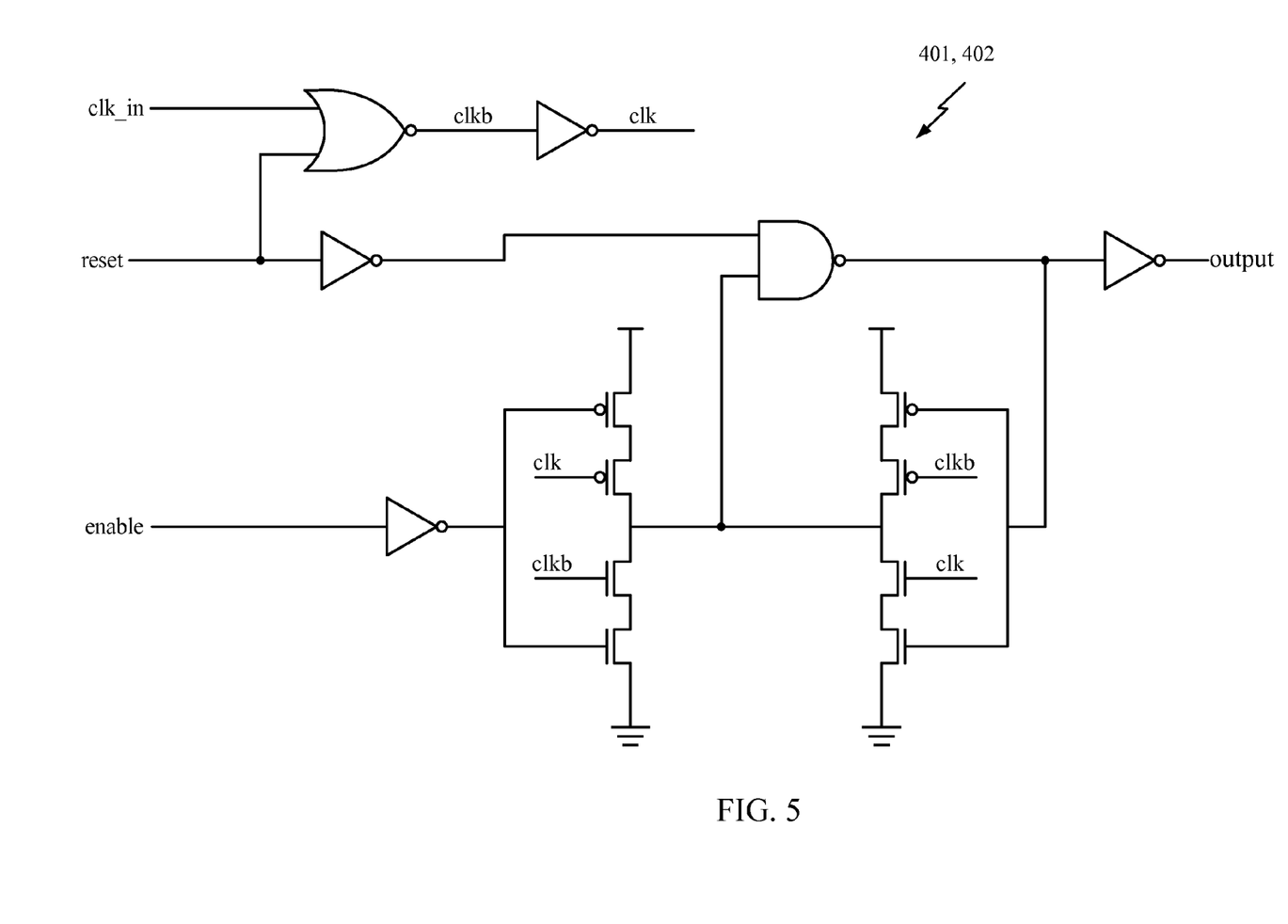
FIG. 5 is a circuit diagram showing an embodiment of a latch circuit portion of the on-chip circuit of FIGURE.

FIG. 5 shows an embodiment of the latches 401 and 402 in accordance with the disclosure. Latches are well known in the art and various implementations may be used. The following implementation is merely one example. Latches 401 and 402 may be, for example, phase 2 (Ø2) latches. For the purpose of discussion, an exemplary implementation of the latches 401 and 402 are described below. The inputs for latches 401 and 402 include a Global Reset signal and the respective first clock signal, clk1, and the first clock enable signal, clk1_enable, for the latch 401, the second clock signal, clk2, and the second clock enable signal, clk2_enable, for the latch 402. A high Global Reset signal resets the respective outputs of the latches 401, 402 and the SR latch 403 to low, so that no word line signal, WL, is output at the beginning of a test cycle. When the clk_in and clk_enable signals for the latch 401 (i.e., the first clk signal, clk1, and the first clock enable signal, clk1_enable) are high, the latch 401 outputs a high (e.g., "1") to the SET input of the SR latch 403, making the SR latch 403 transparent and passing the first clock signal, clk1. At this time, the Global Reset signal is set low so as not to inhibit operation of the latches 401, 402 and 403. Similarly, when the clk_in and clk_enable signals for the latch 402 (i.e., the second clock signal, clk2, and the second clock enable signal, clk2_enable) are high, the latch 402 outputs a high signal to the OR gate 404. Regardless of whether the Global Reset signal is low at this time, the OR gate 404 outputs a high signal to the RST input of the SR latch 403, taking the signal low, effectively ending the word line signal, WL.

Figure 6:
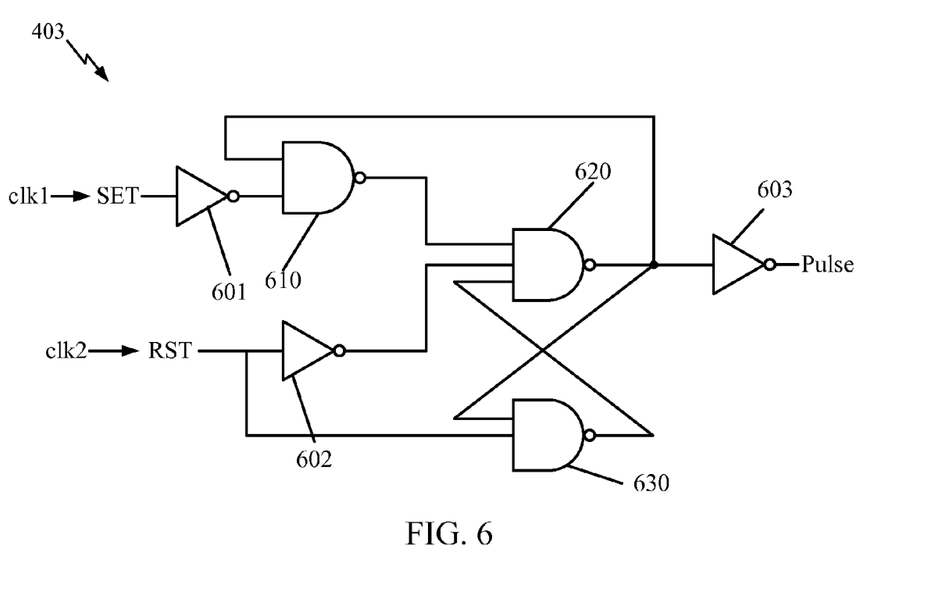
FIG. 6 is a circuit diagram showing an embodiment of a SET-RESET latch circuit portion of the on-chip circuit of FIG. 4.

FIG. 6 shows a circuit of an embodiment of the SR latch 403 in accordance with the disclosure. Set-Reset latches are well known in the art, and various implementations may be used. For the purpose of discussion, an exemplary implementation of the SR latch is described with reference to FIG. 6. An inverter 601 receives the first clock signal, clk1, at the SET input to the latch 403 and an inverter 602 and a NAND gate 630 receive the second clock signal, clk2, at the RST input to the latch 403. The output of the inverter 601 is an input to a first input of an NAND gate 610. The output of the NAND gate 610 is a first input to a NAND gate 620. The output of the inverter 602 is a second input of the NAND gate 620. The output of the NAND gate 620 is fed back as a second input to the NAND gate 630, as a second input to the NAND gate 610, and as an input to an inverter 603. The output of the NAND gate 630 is fed back as a third input to the NAND gate 620. Accordingly, the inverter 603 outputs a pulse starting with the beginning of the first clock signal, clk1, and ending with the beginning of the second clock signal, clk2.

Figure 7:
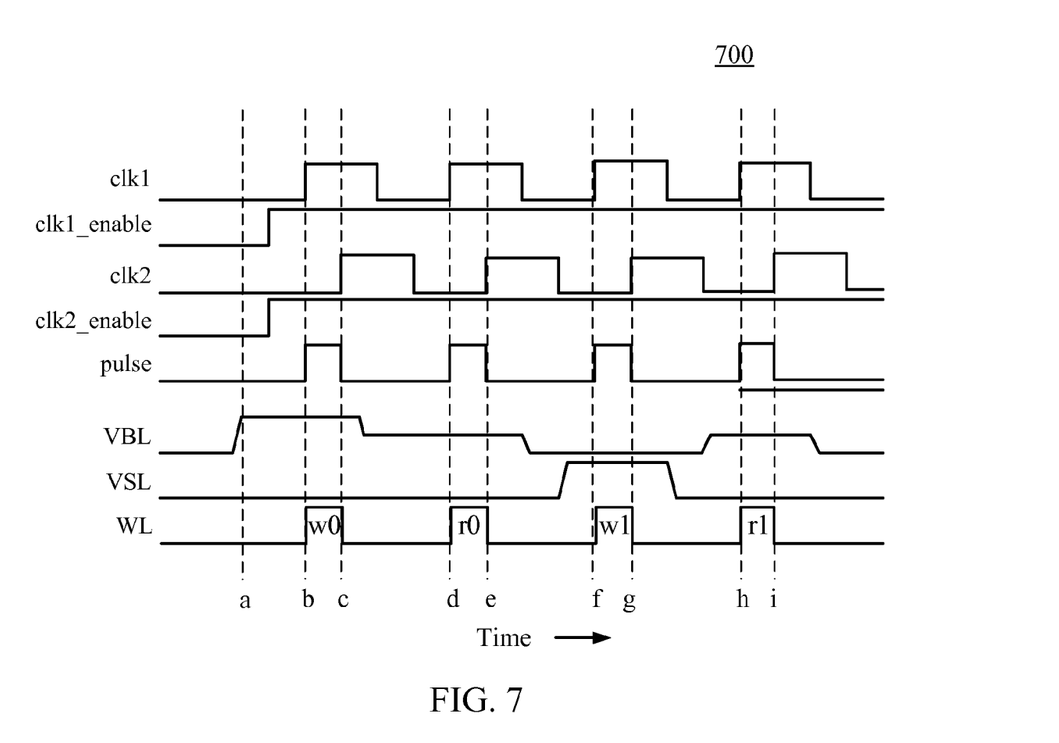
FIG. 7 is a timing diagram of input and output signals for testing an embodiment of an array of memory bitcells.

FIG. 7 shows a timing diagram 700 for an embodiment of a flexible word line pulsing system based on the skew of two clock signals, in accordance with the disclosure. The features of the timing diagram are described with reference to times a-i.

Prior to a time a, the first clock signal, clk1, first clock enable signal, clk1_enable, second clock signal, clk2, and second clock enable signal, clk2_enable are initialized to "off" or "low" states (e.g., logical "0"), which may be, for example, zero volts, and a variable bit line voltage VBL and a variable source line voltage VSL are also low, so that there is substantially no voltage difference applied across an MTJ bitcell 200. At the time a, there is no signal emitted from the latch 403. At the time a, the bit line voltage VBL level is set to a first value (e.g., 2.5 volts), while the source line voltage VSL remains low. The voltage difference VBL-VSL is large enough to write a state 0 polarization to the MTJ 201. However, since there is no word line signal, WL, to open the gate G of the transistor 202 to permit current flow, no polarization state is yet written.

Between time a and time b, the first clock enable signal, clk1_enable, and the second clock enable signal, clk2_enable, go high, so that the first clock signal, clk1 and and the second clock signal, clk2, pulses can be sampled. At time b, the first clock signal, clk1, goes high, taking the pulse line signal, pulse, high. Since the word line signal, WL, is the image of the pulse line signal, pulse, the word line signal, WL, goes high to open the gate G of the transistor 202. Because the relative voltage VBL-VSL is configured to write a state 0, the word line signal, WL, is here referred to as a w0 pulse during this time interval. At time c, the second clock signal, clk2, goes high, taking the pulse signal, pulse, low, and simultaneously ending the w0 pulse.

Between time c and time d, the bit line voltage, VBL, is reduced to a level so that the voltage difference VBL-VSL is small enough to read the resistance of the MTJ bitcell 200 but not to change the state of the MTJ 201. At time d, the first clock signal, clk1, goes high, taking the pulse signal, pulse, output from the latch 402 high simultaneously with the word line signal, WL, to open the gate G again. Because the voltage across the MTJ bitcell 200 is the smaller read mode value, the word line signal, WL, is referred to here as an r0 pulse during the time interval d-e. At time e, the second clock signal, clk2, goes high, taking the pulse signal output from the latch 402 low, ending the word line signal, WL, r0 pulse.

During the time interval between c and f, the bit line voltage signal, VBL, goes low, and the source line voltage, VSL, goes high, substantially reversing the write mode voltage across the MTJ bitcell 200 that occurred during the interval b-c. This corresponds to the voltage applied to write a state 1 polarization to the MTJ 201. As described above, the first clock signal, clk1, goes high at time f and the second clock signal, clk2, goes high at time g. During this time interval, the pulse signal, pulse, output from the latch 403 is provided and the word line signal, WL, opens the gate of the transistor 202, writing the state 1 polarization to the MTJ 201. This write signal is referred to here as a w1 pulse, because a state 1 polarization is being written.

During the time interval g-h, the bit line voltage VBL, is changed to the same value selected in time interval c-d, and the source line voltage, VSL, is taken low, again as in interval c-d, with the result that a read mode level of voltage is applied to the MTJ bitcell 200 when the gate G of the transistor 202 is open. During time interval h-i, the first and second clock signals, clk1, and clk2, again operate to provide the signal rising edges to form the word line signal, WL, as a pulse of the time duration h-i. Because the MTJ 201 has a state 1, the pulse formed in the word line signal, WL, to read the MTJ 201 resistance at this time is referred to as an r1 pulse.

Figure 8:
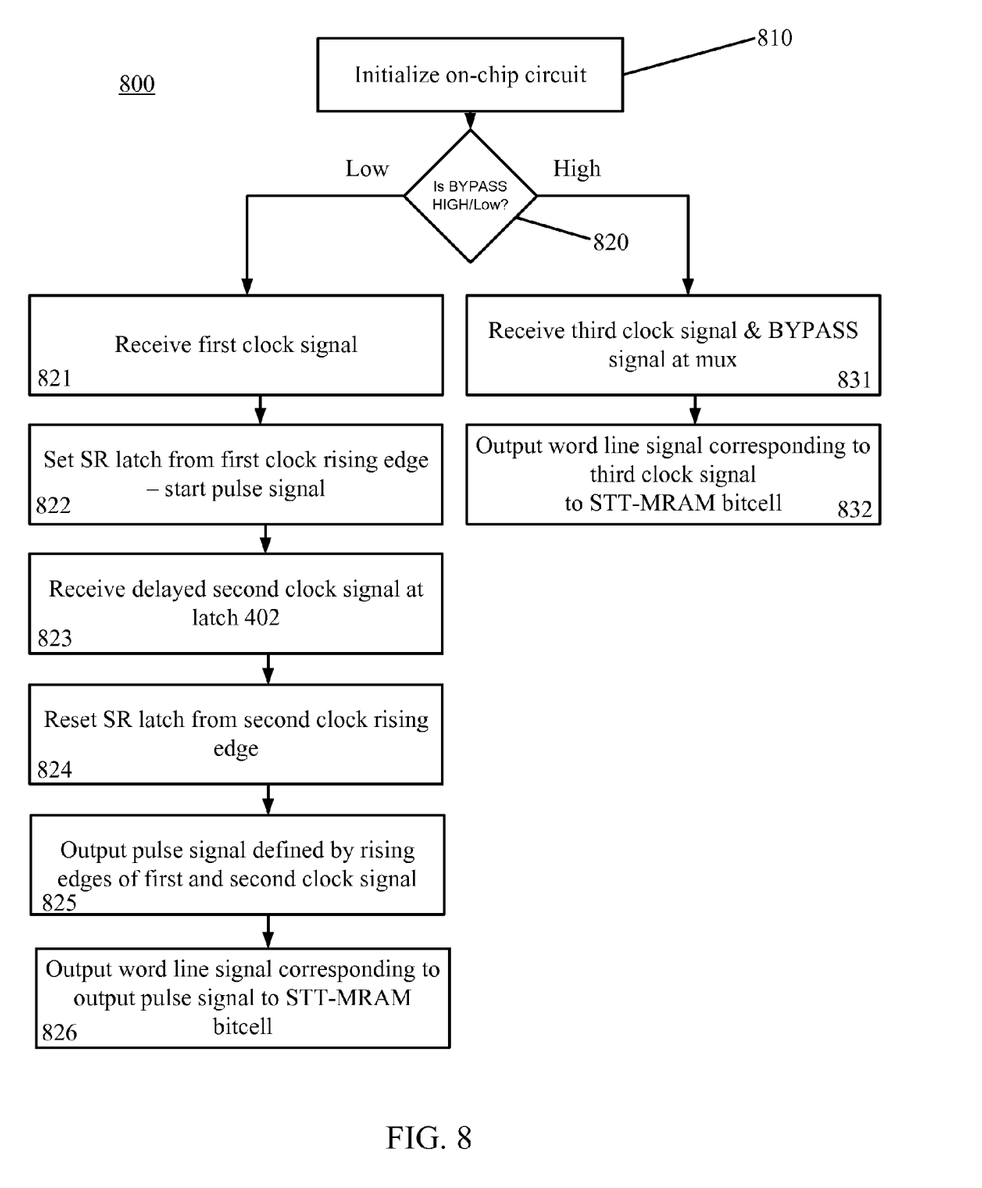
FIG. 8 is a flow diagram illustrating a method of pulsing a word line in a memory bitcell.

FIG. 8 is a flow chart showing a method 800 for generating a flexible word line pulse to a gate of an MTJ bitcell of an STT-MRAM chip with an on-chip test circuit. In block 810, the on-chip circuit is initalized by a Global Reset signal resetting all latches (401, 402, 403). In decision block 820, it is determined if the bypass signal, BYPASS, to the mux 405 is high or low. If the bypass signal, BYPASS, is low, the method continues at block 821, where the latch 401 receives the first clock signal, clk1, and first clock enable signal, clk1_enable signal, and provides a high signal to the SET input of the SR latch 403 (block 822). This begins a signal that is output from the SR latch 403, i.e., the beginning of a pulse. In block 823, the delayed second clock signal, clk2, and the second clock enable signal, clk2_enable, are received at the latch 402, which provides a high signal to the RST (i.e., reset) input of the SR latch 403 (block 824), This reset takes the output signal from the SR latch 403 low, ending the pulse, which has a duration determined by the delay between the first clock signal, clk1, leading edge and the second clock signal, clk2, leading edge (block 825).

The output pulse from the SR latch 403 is then input to the mux 405 which, because the bypass signal, BYPASS, is low, outputs a word line signal, WL, of length corresponding to the pulse output from the SR latch 403. The word line signal, WL, is then output to the MTJ bitcell 200 of the STT-MRAM memory (block 826). The word line signal, WL, for example, is applied to the gate G of the transistor 202 of the MTJ bitcell 200. In one embodiment, a local word line signal is provided as an output of an AND gate by ANDing the word line signal, WL, with a global word line signal.

If the bypass signal, BYPASS, is high (in decision block 820), the mux 405 admits the third clock signal, clk3, (block 831), and then outputs a word line signal, WL, with a pulse length corresponding to the third clock signal, clk3 (block 832). Again, a local word line signal can be created by ANDing the word line signal, WL, with a global word line signal. The local word line signal can be output to the MTJ bitcell 200 of the STT-MRAM memory, as described above.

Although specific circuitry has been set forth, it will be appreciated by those skilled in the art that not all of the disclosed circuitry is required to practice the disclosure. Moreover, certain well known circuits have not been described, to maintain focus on the disclosure. Similarly, although the description refers to logical "0" or "low" and logical "1" or "high" in certain locations, one skilled in the art appreciates that the logical values can be switched, with the remainder of the circuit adjusted accordingly, without affecting operation of the present disclosure.

Figure 9:
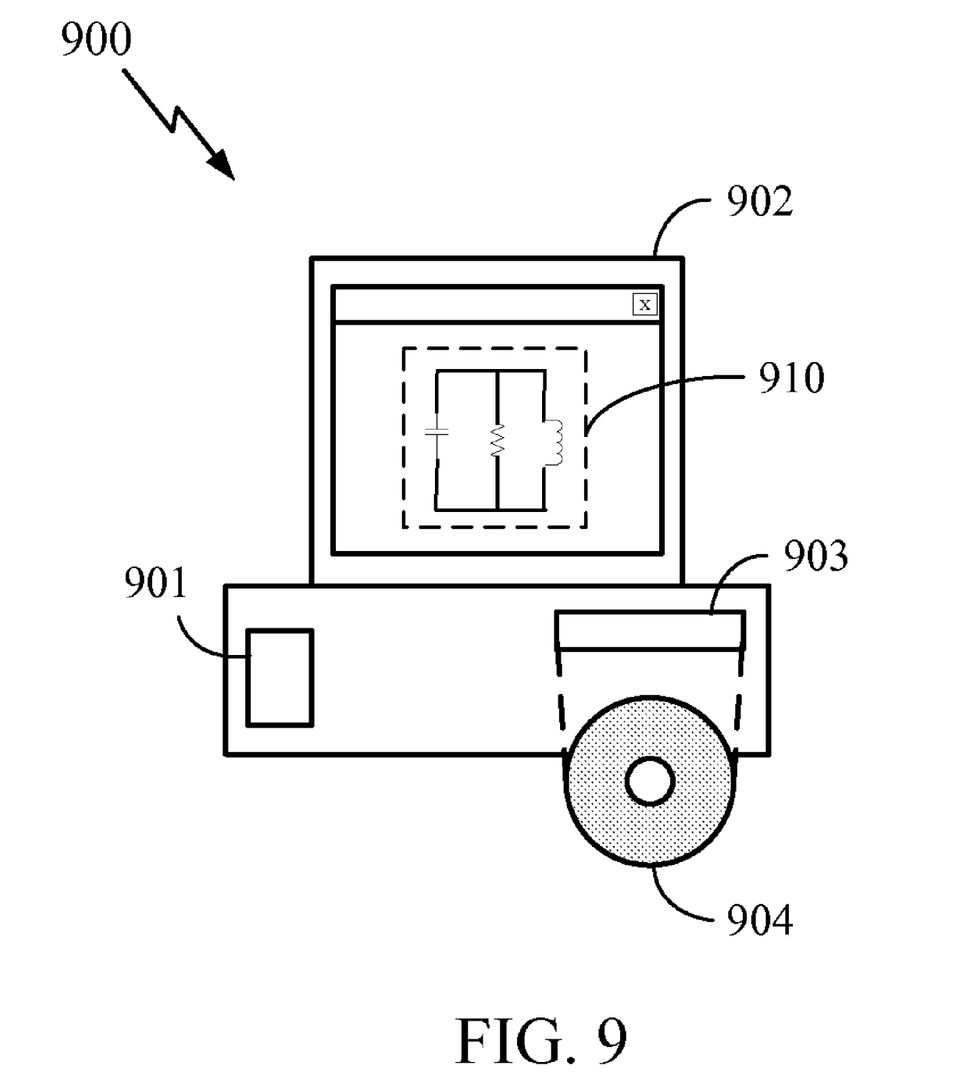
FIG. 9 is a block diagram illustrating a design workstation used for circuit, layout, and logic design of the disclosed semiconductor integrated circuit.

FIG. 9 is a block diagram illustrating a design workstation used for circuit, layout, and logic design of the disclosed semiconductor integrated circuit. A design workstation 900 includes a hard disk 901 containing operating system software, support files, and design software such as Cadence or OrCAD. The design workstation 900 also includes a display 902 to facilitate design of a circuit design 910. The circuit design 910 may be the memory circuit as disclosed above. A storage medium 904 is provided for tangibly storing the circuit design 910. The circuit design 910 may be stored on the storage medium 904 in a file format such as GDSII or GERBER. The storage medium 904 may be a CD-ROM, DVD, hard disk, flash memory, or other appropriate device. Furthermore, the design workstation 900 includes a drive apparatus 903 for accepting input from or writing output to the storage medium 904.

Data recorded on the storage medium 904 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 904 facilitates the design of the circuit design 910 by decreasing the number of processes for designing semiconductor ICs.

Although the present disclosure and its advantages have been described in detail, it should be understood that various changes, substitutions and alterations can be made herein without departing from the spirit and scope of the disclosure as defined by the appended claims. For example, formation of the word line pulse has been described in terms of triggering the start and end of the pulse based on the relative skew of the rising edges of the first and second clock signal, clk1 and clk2. Alternatively, formation of the word line signal, WL, may be determined from the relative skew of the falling edges of the the first and second clock signal, clk1 and clk2 or any combination of rising and falling edges. Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method for generating a signal having a variable pulse width on a semiconductor device, comprising:
    receiving a first clock signal on the semiconductor device;
    receiving a second clock signal on the semiconductor device having a predetermined delay relative to the first clock signal;
    outputting a final signal having a rising edge triggered by the first clock signal and a falling edge triggered by the second clock signal; and
    providing the final output signal to circuitry on the semiconductor device.

2. The method of claim 1, in which the outputting comprises outputting the final signal with the rising edge triggered by a rising edge of the first clock signal and the falling edge triggered by a rising edge of the second clock signal.

3. The method of claim 1, further comprising:
    providing the final signal to at least one transistor gate on the semiconductor device.

4. The method of claim 1, further comprising:
    setting the variable delay from less than 1 ns to approximately 0.9 ms.

5. The method of claim 1, further comprising:
    receiving a global reset signal at a first latch, a second latch, and a combinational logic circuit;
    receiving at the first latch the first clock signal and a first clock enable signal; and
    receiving at the second latch the second clock signal and a second clock enable signal.

6. The method of claim 5, further comprising:
    inputting to the combinational logic circuit an output of the second latch;
    inputting the output of the combinational logic circuit to a reset input of a set-reset latch; and outputting from the set-reset latch a pulse signal on the basis of the global reset signal, the first clock signal, the first clock enable signal, the second clock signal, and the second clock enable signal.

7. The method of claim 1, wherein the semiconductor device is applied in an electronic device, selected from a group consisting of a set top box, music player, video player, entertainment unit, navigation device, communications device, personal digital assistant (PDA), fixed location data unit, and a computer, into which the semiconductor device is integrated.

8. A method for generating a signal having a variable pulse width on a semiconductor device, comprising:
receiving a first clock signal on the semiconductor device;
receiving a second clock signal on the semiconductor device having a variable delay relative to the first clock signal;
outputting a final signal having a rising edge triggered by the first clock signal and a falling edge triggered by the second clock signal; and
providing the final output signal to circuitry on the semiconductor device,
wherein the outputting comprises outputting the final signal with the rising edge triggered by a rising edge of the first clock signal and the falling edge triggered by a rising edge of the second clock signal, and further including:
setting a set-reset latch circuit on a basis of the rising edge of the first clock signal;
resetting the set-reset latch circuit on a basis of the rising edge of the second clock signal; and
outputting from the set-reset latch circuit a pulse signal having a pulse width determined on the basis of the setting and resetting of the latch circuit.

9. The method of claim 8, further comprising:
receiving at a multiplexer the pulse signal from the set-reset latch circuit, a third clock signal and a bypass signal; and
outputting either the third clock signal or the pulse signal, as a word line signal, on the basis of the bypass signal.

10. The method of claim 9, further comprising:
receiving the word line signal from the multiplexer at a first input to a combinational logic circuit;
receiving a global word line signal at a second input of the combinational logic circuit; and
outputting the final signal from the combinational logic circuit on the basis of the global word line signal and the word line signal.

11. The method of claim 9, further comprising:
setting the third clock signal to have a pulse width of any duration in time length.

12. A method for generating a signal having a variable pulse width on a semiconductor device, comprising:
receiving a first clock signal on the semiconductor device;
receiving a second clock signal on the semiconductor device having a variable delay relative to the first clock signal;
outputting a final signal having a rising edge triggered by the first clock signal and a falling edge triggered by the second clock signal;
providing the final output signal to circuitry on the semiconductor device;
receiving a global reset signal at the semiconductor device; and
outputting a null signal to circuitry on the semiconductor device on the basis of the global reset signal to enable reading and writing a polarization state to an STT-MRAM cell.

13. An on-chip variable pulse width signal generating circuit comprising:
a first on-chip latch configured to receive a first clock signal;
a second on-chip latch configured to receive a second clock signal delayed from the first clock signal by a predetermined amount; and
an on-chip set-reset latch configured to receive a signal output from the first latch and a signal output from the second latch, and further configured to output a pulse of time duration based on a delay of the signal from the second latch relative to the signal from the first latch.

14. The signal generating circuit of claim 13, in which the first on-chip latch and the second on-chip latch are phase 2 (Ø2) latches.

15. The signal generating circuit of claim 14, in which the circuit is incorporated in a device selected from the group consisting of a mobile phone, personal data assistant (PDA), navigation device, fixed location data unit, set-top box, music player, video player, entertainment unit, and computer.

16. The signal generating circuit of claim 13, in which the circuit is integrated into a semiconductor die.

17. An on-chip variable pulse width signal generating circuit comprising:
a first on-chip latch configured to receive a first clock signal;
a second on-chip latch configured to receive a second clock signal delayed from the first clock signal by a variable amount; and
an on-chip set-reset latch configured to receive a signal output from the first latch and a signal output from the second latch, and further configured to output a pulse of time duration based on a delay of the signal from the second latch relative to the si nal from the first latch,
wherein,
the first on-chip latch is configured to receive a first clock enable signal and a global reset signal and to output a first signal on the basis of the received first clock signal, first clock enable signal and the global reset signal; and
the second on-chip latch is configured to receive a second clock enable signal and a global reset signal, and to output a second signal on the basis of the received second clock signal, second clock enable signal, and the global reset signal.

18. The signal generating circuit of claim 17, further comprising:
a combinational logic circuit configured to receive the global reset signal and the second signal from the second on-chip latch, wherein the logic circuit is further configured to output a reset signal on the basis of the received global reset signal and the reset signal from the second on-chip latch.

19. The signal generating circuit of claim 18, further comprising:
a multiplexer configured to receive the output pulse from the set-reset latch, a bypass signal, and a third clock signal, and further configured to output either the output pulse from the set-reset latch or the third clock signal based on a level of the bypass signal.

20. The signal generating circuit of claim 19, further comprising:
a second combinational logic circuit configured to receive a global word line signal and the output from the multiplexer, and further configured to output a signal corresponding to the output of the multiplexer on the basis of the global word line signal.

21. An on-chip variable pulse width signal generating circuit for testing a spin-torque-transfer (STT) magnetic tunnel junction (MTJ) memory cell comprising:
   a first on-chip latch configured to receive a first clock signal;
   a second on-chip latch configured to receive a second clock signal delayed from the first clock signal by a variable amount;
   an on-chip set-reset latch configured to receive a signal output from the first latch and a signal corresponding to an output from the second latch, and further configured to output a pulse of time duration based on the delay of the second clock signal relative to the signal from the first clock signal; and
   an STT-MTJ memory cell configured to receive a final signal based on the output pulse from the set-reset latch, the STT-MTJ memory cell further comprising:
   a bit line adapted to receive a bit line voltage; an MTJ comprising a free magnetic layer coupled to the bit line and a fixed magnetic layer coupled to a drain of a transistor;
   a source of the transistor coupled to a source line, the source line adapted to receive a source line voltage; and
   a gate of the transistor adapted to receive a signal corresponding to the output pulse of the set-reset latch.

22. The signal generating circuit of claim 21, in which the circuit is integrated into a device selected from the group consisting of a set top box, music player, video player, entertainment unit, navigation device, communications device, personal digital, assistant (PDA), fixed location data unit, and a computer.

23. A method for generating a signal having a variable pulse width on a semiconductor chip, comprising the steps of:
   receiving a first clock signal on the chip;
   receiving a second clock signal on the IC chip having a predetermined delay relative to the first clock signal;
   outputting a final signal having a rising edge triggered by the first clock signal and a falling edge triggered by the second clock signal; and
   providing the final output signal to circuitry on the chip.

24. The method of claim 23, wherein the semiconductor chip is applied in an electronic device, selected from a group consisting of a sot top box, music player, video player, entertainment unit, navigation device, communications device, personal digital assistant (PDA), fixed location data unit, and a computer, into which the semiconductor chip is integrated.

25. An on-chip variable pulse width signal generating circuit comprising:
   a first on-chip means for receiving a first clock signal;
   a second on-chip means for receiving a second clock signal delayed from the first clock signal by a predetermined amount; and
   a third on-chip means for receiving a signal output from the first receiving means and a signal output from the second receiving means, and for outputting a pulse of time duration based on a delay of the signal received by the second receiving means relative to the signal received by the first receiving means.

26. The signal generating circuit of claim 25, in which the circuit is integrated into a semiconductor die.

27. The signal generating circuit of claim 25, in which the circuit is integrated into a device selected from the group consisting of a set top box, music player, video player, entertainment unit, navigation device, communications device, personal digital assistant (PDA), fixed location data unit, and a computer.

* * * * *